United States Patent
Phansathitwong et al.

(10) Patent No.: US 7,872,530 B2
(45) Date of Patent: Jan. 18, 2011

(54) FLEXIBLE DYNAMIC RANGE AMPLIFIER

(75) Inventors: Kittichai Phansathitwong, Lund (SE); Henrik Sjöland, Löddeköpinge (SE)

(73) Assignee: Telefonaktiebolaget lm Ericsson (publ), Stockholm (SE)

( * ) Notice: Subject to any disclaimer, the term of this patent is extended or adjusted under 35 U.S.C. 154(b) by 0 days.

(21) Appl. No.: 12/530,865

(22) PCT Filed: Mar. 13, 2007

(86) PCT No.: PCT/SE2007/050145
§ 371 (c)(1),
(2), (4) Date: Oct. 8, 2009

(87) PCT Pub. No.: WO2008/111883
PCT Pub. Date: Sep. 18, 2008

(65) Prior Publication Data
US 2010/0109780 A1    May 6, 2010

(51) Int. Cl.
*H03F 3/45* (2006.01)
(52) U.S. Cl. ...................... 330/253; 330/261
(58) Field of Classification Search .............. 330/51, 330/69, 253, 261
See application file for complete search history.

(56) References Cited

U.S. PATENT DOCUMENTS 5,212,455 A * 5/1993 Pernici et al. ............... 330/253

7,489,193 B2 * 2/2009 Adachi .................. 330/253
7,737,782 B1 * 6/2010 Sudou ................... 330/253
7,786,799 B2 * 8/2010 Bhattacharya et al. ...... 330/253

FOREIGN PATENT DOCUMENTS

EP         1748553 A1    1/2007
WO    2004/098048 A2   11/2004

OTHER PUBLICATIONS

Garcia, P. et al. "Improved High Dynamic Range Switched Gain Low-Noise Amplifier for Wide-Band CDMA Applications." Proceedings of the 27th European Solid-State Circuits Conference (ESSCIRC 2001), Sep. 18-20, 2001.

* cited by examiner

*Primary Examiner*—Henry K Choe
(74) *Attorney, Agent, or Firm*—Coats & Bennett, P.L.L.C.

(57) ABSTRACT

An amplifying device (10) includes first, second, third and fourth transistors (M1, M2, M3, M4). In the first and third transistors (M1, M3) the source is connected to an input signal source (IN+, IN−), the gate is connected to a biasing potential (VB) and the drain is connected to a signal output (O+, O−). There is a first and second branch (B1, B2) between the source and drain of the first and third transistor (M1, M3), respectively, each including a corresponding second or fourth transistor (M2, M4). The device also includes a third branch (B3) comprising a first capacitor (C1) and a first switch (SW1) connected between the first transistor (M1) source and the third transistor (M3) gate, and a fourth branch (B4) comprising a second capacitor (C2) and a second switch (SW2) connected between the third transistor (M3) source and the first transistor (M1) gate.

18 Claims, 3 Drawing Sheets

FLEXIBLE DYNAMIC RANGE AMPLIFIER

TECHNICAL FIELD OF THE INVENTION

The present invention relates to the field of amplifiers. More particularly the present invention relates to an amplifying device as well as a wireless transceiver and a radio transmission device comprising such an amplifying device.

DESCRIPTION OF RELATED ART

In radio-frequency low noise amplifiers (LNA), noise and linearity are two important factors. However they cannot readily be combined. A high gain amplifier can have low noise, but then the linearity is sacrificed, while a low gain amplifier will have a better linearity but more noise. The noise and linearity performance of amplifiers can be quantified by the dynamic range, which is the ratio of the lowest detectable signal strength limited by the noise to the highest signal strength where 1 dB compression due to non-linearities will occur.

In the field of wireless communication, such as mobile telephony, there are different requirements on the low noise amplifiers depending on the position of a wireless terminal in relation to the wireless access points of the network. If a wireless terminal is for instance located a long distance from a wireless access point, it is important that the noise is as low as possible in order to be able to receive weak signals. If on the other hand interfering signals from other wireless terminals are strong, the linearity should be high in order to avoid desensitation or blocking of the receiver.

It is therefore of interest to provide a low noise amplifying device that is capable of selectively providing a good linearity or a low noise and high gain depending on the circumstances. This is becoming increasingly important not only because the power consumption may be reduced, but also since the supply voltages of modern semiconductor processes are constantly reduced, resulting in difficulties in achieving a sufficiently high dynamic range to cover both these situations.

This has traditionally been solved through using simple controlled gain reduction by switching in different resistive loads at the output. However, then the dynamic range performance is degraded.

There is always a trade-off in wireless transceivers between the achieving of a high dynamic range and wasting power. It is especially difficult to achieve a high dynamic range at low supply voltages.

There is therefore a need to provide an improved low noise amplifying device that is capable of either providing a good linearity or a low noise and high gain depending on the circumstances.

SUMMARY OF THE INVENTION

The present invention is directed towards enabling the selective provision of high gain and low noise or good linearity in an amplifying device.

One object of the present invention is to provide an amplifying device, which is capable of selectively providing a good linearity or a low noise and high gain.

According to a first aspect of the present invention this is achieved by an amplifying device comprising:

a first transistor having a source connected to a first input signal source for receiving a first half of an input signal, a gate connected to a biasing potential and a drain connected to a first signal output where a first half of an output signal is provided, a first breakable branch connected between the source and drain of the first transistor and comprising a second transistor, a third transistor having a source connected to a second input signal source for receiving a second half of an input signal, a gate connected to a biasing potential and a drain connected to a second signal output where a second half of an output signal is provided, a second breakable branch connected between the source and drain of the third transistor and comprising a fourth transistor, a third breakable branch comprising a first capacitor and a first switch connected between the source of the first transistor and the gate of the third transistor, and a fourth breakable branch comprising a second capacitor and a second switch connected between the source of the third transistor and the gate of the first transistor, wherein the first and second switches are arranged to receive a first switching signal for providing a capacitive cross-coupled mode of operation of the amplifying device and the first and second breakable branches are arranged to receive a second switching signal for connecting the second transistor in parallel with the first transistor and for connecting the fourth transistor in parallel with the third transistor when the standard non cross-coupled common-gate mode of operation of the amplifying device is chosen.

The amplifying device may with advantage be provided in a wireless transceiver as well as in a radio transmission device such as a wireless access point or a wireless terminal.

The terms gate, source and drain are here intended to cover equivalent terms, such as base, emitter and collector.

The invention has the following advantages. It provides one device that can selectively provide either high gain and low noise or good linearity. It is able to do this at low supply voltages and without degrading the dynamic range. The combination of two modes of operation does in fact improve the effective dynamic range of the amplifying device.

It should be emphasized that the term "comprises/comprising" when used in this specification is taken to specify the presence of stated features or components, but does not preclude the presence or addition of one or more other features, components or groups thereof.

BRIEF DESCRIPTION OF THE DRAWINGS

The present invention will now be described in more detail in relation to the enclosed drawings, in which.

DETAILED DESCRIPTION OF EMBODIMENTS

The present invention relates to an amplifying device that can be used advantageously for wireless communication because it either provides good linearity or low noise and high gain, which is of interest to use in different communication situations in wireless networks.

The present invention is thus directed towards providing one amplifying device that can be operated to switch between two configurations in order to provide good linearity or low noise and high gain. The amplifying device is with advantage a radio frequency low noise amplifying device.

Figure 1:
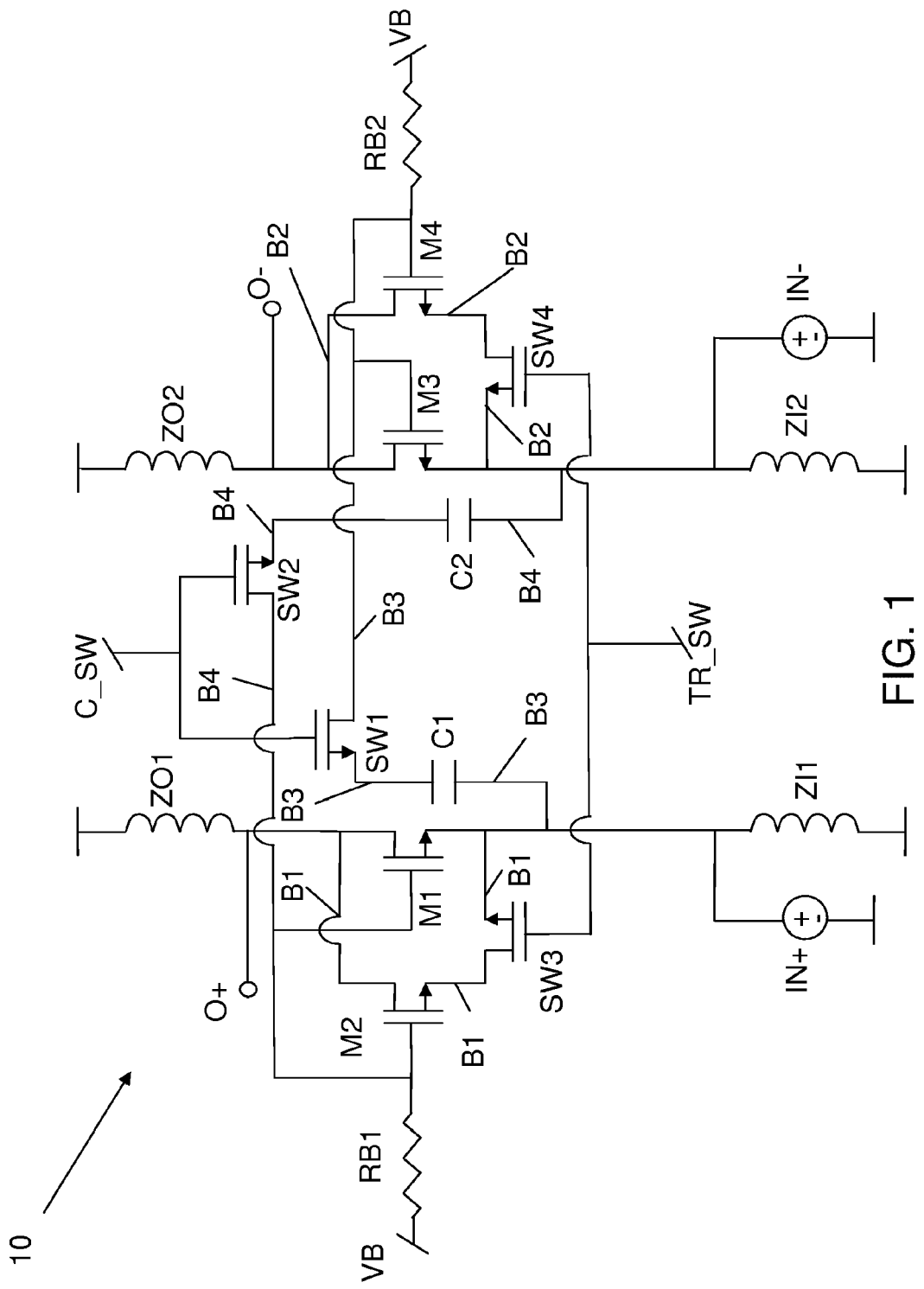
FIG. 1 shows a circuit chart of an amplifying device according to a first embodiment of the present invention.

Such an amplifying device 10 according to a first embodiment of the present invention is shown in a circuit chart in FIG. 1. The amplifying device 10 includes a first pair of transistors, comprising a first transistor M1 and a second transistor M2. Here the drain of the first transistor M1 is connected to a first signal output O+ where a first half of an output signal is provided. The drain of the first transistor M1 is also connected to signal ground via a first output impedance ZO1, which in this embodiment is an inductance. The gate of the first transistor M1 is arranged to receive a biasing potential, which in this first embodiment is done through connecting the gate to a biasing potential VB via a first biasing resistor RB1. The source of the first transistor M1 is connected to a first end of a first input signal source IN+, from which it receives a first half of an input signal. The second end of the first input signal source IN+ is connected to signal ground. In parallel with this input signal source IN+ there is provided a first input impedance ZI1, which in this embodiment is an inductor. In parallel with the first transistor M1, there is provided a first breakable branch B1, which is connected between the source and drain of the first transistor M1. The branch B1 includes the second transistor M2 and connects the drain of this second transistor M2 to the drain of the first transistor and the source of the second transistor M2 to the source of the first transistor M1. The gate of the second transistor M2 is in this first embodiment also connected to the biasing potential VB via a biasing impedance in the form of a first biasing resistor RB1.

The low noise amplifying device 10 also includes a second pair of transistors, comprising a third and a fourth transistor M3 and M4. Here the drain of the third transistor M3 is connected to a second signal output O–, where a second half of an output signal is provided. The drain of the third transistor M3 is also connected to signal ground via a second output impedance ZO2, which in this embodiment is an inductance. The gate of the third transistor M3 is connected to the biasing potential VB via a second biasing resistor RB2 and the source of the third transistor M3 is connected to a first end of a second input signal source IN–, from which it receives a second half of an input signal. The second end of the second input signal source IN– is connected to signal ground. In parallel with this input signal source IN– there is provided a second input impedance ZI2, which in this embodiment is also an inductor. In parallel with the third transistor M3, there is provided a second breakable branch B2, which is connected between the source and the drain of the third transistor M3. The branch B2 includes the fourth transistor M4 and connects the drain of this fourth transistor M4 to the drain of the third transistor M3 and the source of the fourth transistor M4 to the source of the third transistor M3. The gate of the fourth transistor M2 is arranged to receive a biasing potential, which in this first embodiment is also done through connecting the gate to the biasing potential VB via a biasing impedance in the form of a second biasing resistor, RB2. The resistances of the first and second biasing resistors RB1 and RB2 should be equal. Also the inductances of the first and second output impedances ZO1 and ZO2 should be equal. The inductances of the first and second input impedances ZI1 and ZI2 should also be equal.

According to the present invention there is furthermore provided a third breakable branch B3 between the source of the first transistor M1 and the gate of the third transistor M3. This third branch B3 comprises a first capacitor C1 and a first switch SW1. The first switch SW1 is in this embodiment provided as a transistor, the source and drain of which are connected in the third branch B3 and the gate of this transistor SW1 is connected to a first switching signal C_SW. There is furthermore provided a fourth breakable branch B4 between the source of the third transistor M3 and the gate of the first transistor M1. This fourth branch B4 comprises a second capacitor C2 and a second switch SW2. The second switch SW2 is in this embodiment also provided as a transistor, the source and drain of which are connected in the fourth branch B4 and the gate of this transistor SW2 is connected to the first switching signal C_SW.

According to this first embodiment, the first branch B1 furthermore comprises a third switch SW3 provided as a transistor, the source and drain of which are connected in the first branch B1 and the gate of this transistor SW3 is connected to a second switching signal TR_SW. Here the source of the switch SW3 is facing the source of the first transistor M1, while the drain is facing the drain of the first transistor M1. Finally the second branch B2 comprises a fourth switch SW4, which in this embodiment is provided as a transistor, the source and drain of which are connected in the second branch B2 and the gate of this transistor SW4 is also connected to the second switching signal TR_SW. Here the source of the switch SW4 is facing the source of the third transistor M3, while the drain is facing the drain of the third transistor M3.

The transistors M1, M2, M3 and M4 and switches SW1, SW2, SW3 and SW4 are in this embodiment all provided as MOSFET transistors.

As can be seen the amplifying device 10 according to this first embodiment is provided as a differential amplifier, which amplifies an input signal provided by the input sources IN+ and IN– for provision of an amplified output signal via the output O+ and O–. In this first embodiment the second and fourth transistors M2 and M4 receive an activating signal, which is here the biasing potential VB. The switches SW1, SW2, SW3 and SW4 furthermore provide switching of the device between two different amplifying modes: a capacitive cross-coupled mode of operation and a standard common-gate mode of operation. This switching is done in order to obtain either a good linear behaviour or low noise and high gain.

When it is desirable to obtain good linear behaviour, the first and the second switches SW1 and SW2 are open through the application of a low voltage level of the first switching signal C_SW, while the third and fourth switches SW3 and SW4 are closed through the application of a high voltage level of the second switching signal TR_SW. Then the third and fourth branches B3 and B4 get disconnected and thus the first and second capacitors C1 and C2 have no influence on the operation. Because of this switching, the second and fourth transistors M2 and M4 furthermore get connected in parallel with the first and third transistors M1 and M3 and thus standard common-gate configuration of the amplifying device 10 is obtained, which provides the desired linear behaviour.

When it is desirable to obtain low noise and high gain, the first and the second switches SW1 and SW2 are closed through the application of a high voltage level of the first switching signal C_SW, while the third and fourth switches SW3 and SW4 are open through the application of a low voltage level of the second switching signal TR_SW. Then the third and fourth branches B3 and B4 get connected between the first and third transistors M1 and M3 and thus the first and second capacitors C1 and C2 do influence the operation of the amplifying device 10. Thus a capacitive cross-coupled configuration of the amplifying device is obtained, which provides the desired low noise and high gain. Opening the third and fourth switches SW3 and SW4 reduces the effective combined input transistor size is thereby reduced, so that a good input match can be achieved in both modes of operation. The cross-coupled mode requires about half the transconductance value compared to the standard common gate.

Figure 2:
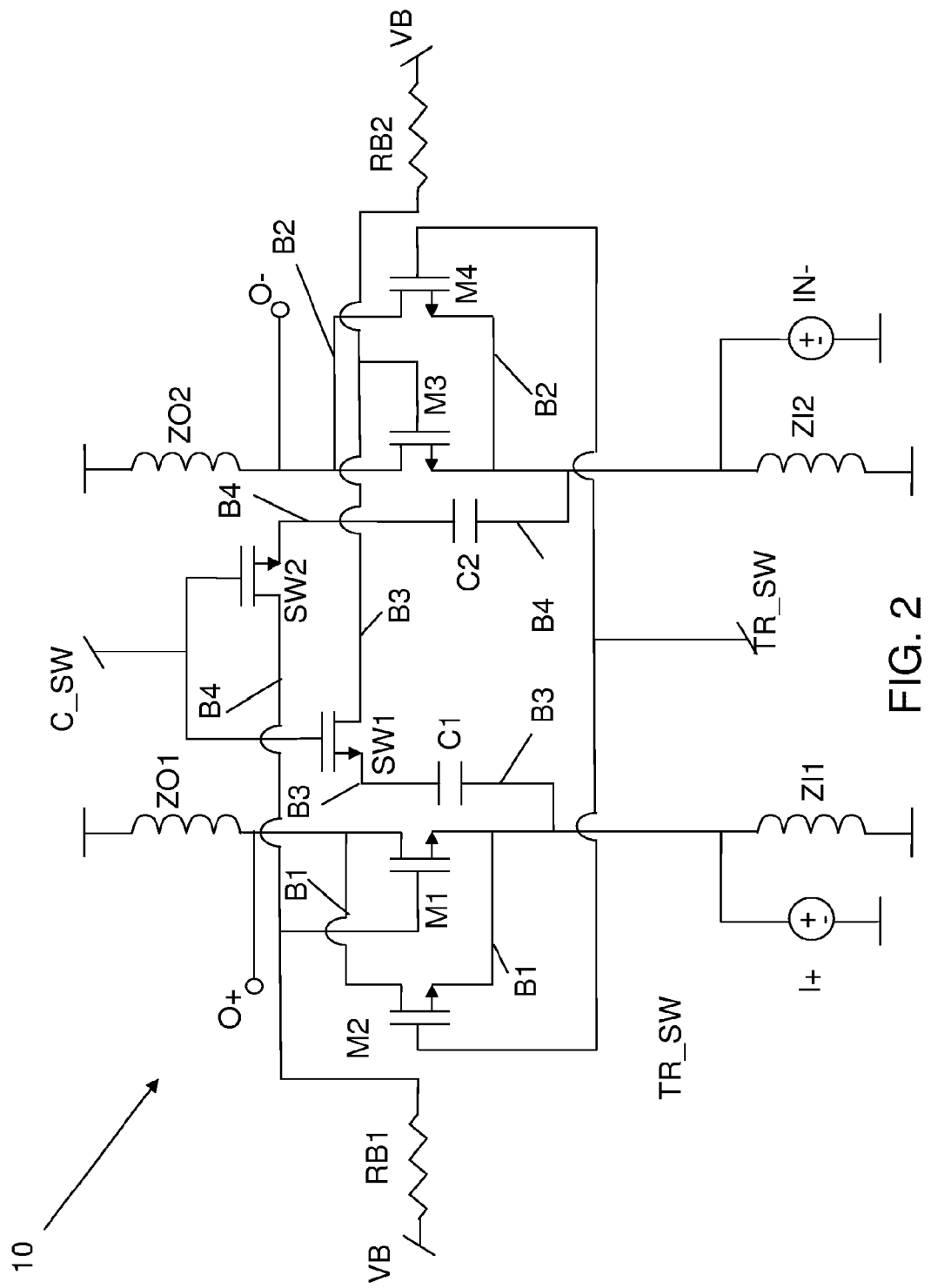
FIG. 2 shows a circuit chart of an amplifying device according to a second embodiment of the present invention, FIG. 3 schematically shows two radio transmission devices, one base station and one mobile station, communicating with each other, where each may include an amplifying device according to the invention.

FIG. 2 shows a circuit chart of a low noise amplifying device 10 according to a second embodiment of the present invention. This second embodiment resembles the first embodiment. The second embodiment differs from the first embodiment in that the first and second branches B1 and B2 do not include the third and fourth switches; instead the gates of the second and fourth transistors M2 and M4 receive the second switching signal directly. The activating signal for the second and fourth transistors M2 and M4 is thus here the second switching signal TR_SW.

The device according to this second embodiment is operated in the same way as the device in the first embodiment in order to obtain the same end results.

However in this second embodiment the high voltage level of the second switching signal TR_SW corresponds to the biasing potential VB in order to enable standard common-gate operation. This was not necessary in the first embodiment.

The noise and linearity performance of amplifying devices can be quantified by the dynamic range, which is the ratio of the lowest detectable signal strength limited by the noise to the highest signal strength where 1 dB compression due to non-linearities will occur.

The above mentioned operation of the power amplifying device 10 has several advantages. It provides one device that can selectively provide either high gain and low noise or good linearity. It is able to do this at low supply voltages and without degrading the dynamic range. In fact the coverage of the dynamic range is improved by the amplifying device according to the present invention.

In the described embodiments the input and output impedances were provided as inductors. It should be realised that they may be resistors instead. The first, second, third and fourth transistors were also provided as MOSFET transistors. It should be realised that they may be any type of transistor, such as JFET and PNP-transistors. Therefore it should also be realised that the term gate is to cover the equivalent term base, the term drain is to cover the equivalent term collector and the term source is to cover the equivalent term emitter. The switches used were realised in the form of MOSFET transistors. It should be realised that they may be any type of transistor, such as JFET and PNP-transistors. The switches are in fact not limited to transistors, but may be realised through any device that can perform switching based on a switching signal. The order in which switches and capacitors are provided in the third and fourth branches are not crucial to the functioning of the present invention. Also the order in which the switches and transistors are provided in the first and second branches in the first embodiment are not crucial to the functioning of the present invention. In the described embodiments the transistors M1 to M4 have been provided as N-type, but it is no problem converting the design to use P-type instead. In the described embodiments the gates of the first and third transistors are furthermore connected to the biasing potential via biasing impedances in the form of biasing resistors. It should be realised that the biasing impedances may also be for instance inductors. The gates of the second and fourth transistors may furthermore be connected to the biasing potential via one common biasing impedance or even directly connected to this biasing potential.

The amplifying device according to the present invention may be provided in either a wireless access point, like a base station, or a wireless terminal, like a mobile station, or in both.

Figure 3:
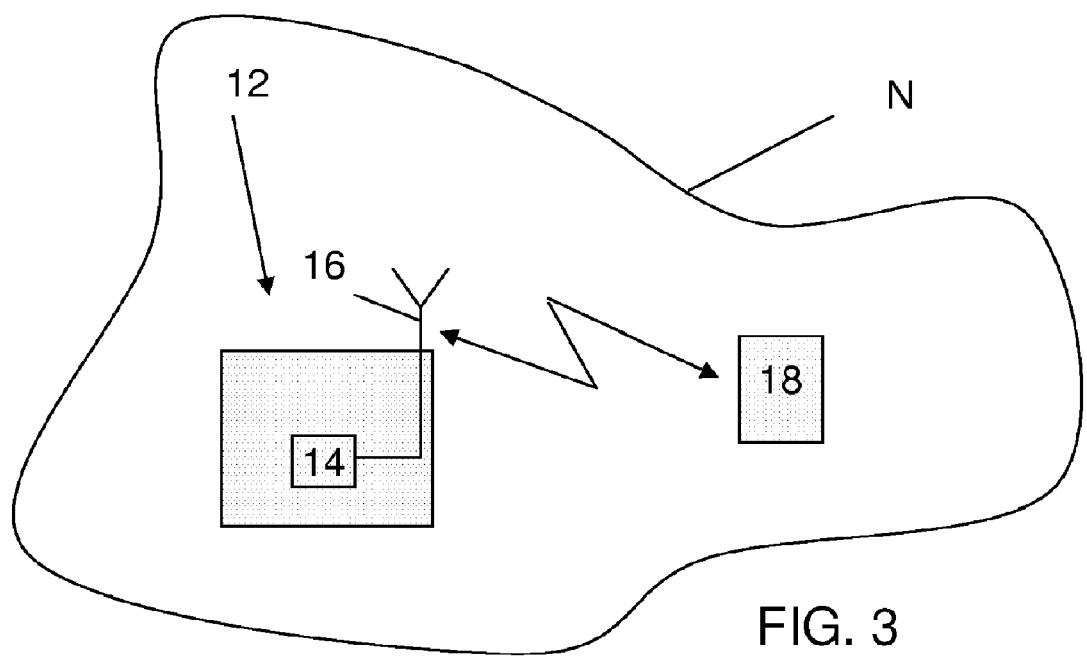
Figure 4:
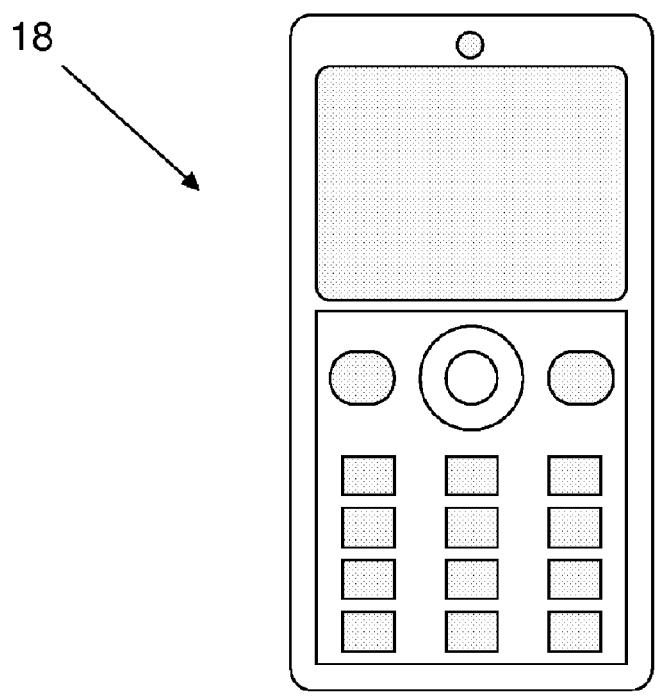
FIG. 4 shows a front view of a wireless terminal in the form of a cellular phone.

FIG. 3 schematically shows one such base station 12 that includes a wireless transceiver 14 including the low noise amplifying device according to the present invention. The wireless transceiver 14 is in turn connected to an antenna 16 for communicating with the mobile station 18 in a wide area network N. The mobile station may be a cellular phone, which is shown in FIG. 4.

When the mobile station is far from the base station 12, the amplifying device is operated to be configured according to the capacitive cross-coupled configuration, while if there is much interference, the amplifying device is operated to be configured according to the standard common-gate configuration.

Although the present invention has been described in connection with specific embodiments, it is not intended to be limited to the specific form set forth herein. Rather, the scope of the present invention is only limited by the accompanying claims.

The invention claimed is:

1. An amplifying device comprising:
   a first transistor having a source connected to a first input signal source for receiving a first half of an input signal, a gate arranged to receive a biasing potential and a drain connected to a first signal output where a first half of an output signal is provided,
   a first breakable branch connected between the source and drain of the first transistor and comprising a second transistor,
   a third transistor having a source connected to a second input signal source for receiving a second half of an input signal, a gate arranged to receive a biasing potential and a drain connected to a second signal output where a second half of an output signal is provided,
   a second breakable branch connected between the source and drain of the third transistor and comprising a fourth transistor,
   a third breakable branch comprising a first capacitor and a first switch connected between the source of the first transistor and the gate of the third transistor, and
   a fourth breakable branch comprising a second capacitor and a second switch connected between the source of the third transistor and the gate of the first transistor,
   wherein said first and second switches are arranged to receive a first switching signal for providing a capacitive cross-coupled mode of operation of the amplifying device and said first and second breakable branches are arranged to receive a second switching signal for connecting the second transistor in parallel with the first transistor and for connecting the fourth transistor in parallel with the third transistor in order to provide a standard common-gate mode of operation of the amplifying device.

2. An amplifying device according to claim 1, wherein the first breakable branch connects the drain of the second transistor to the drain of the first transistor and the source of the second transistor to the source of the first transistor and the second breakable branch connects the drain of the fourth transistor to the drain of the third transistor and the source of the fourth transistor to the source of the third transistor.

3. An amplifying device according to claim 1, wherein the first input signal source is connected between the source of the first transistor and signal ground in parallel with a first input impedance and the second input signal source is connected between the source of the third transistor and signal ground in parallel with a second input impedance.

4. An amplifying device according to claim 1, wherein the drain of the first transistor is connected to signal ground via a first output impedance and the drain of the third transistor is connected to signal ground via a second output impedance.

5. An amplifying device according to claim 1, wherein the gates of the first and third transistors are connected to the biasing potential via at least one biasing impedance.

6. An amplifying device according to claim 1, wherein the gates of the second and fourth transistors are arranged to receive an activating signal.

7. An amplifying device according to claim 6, wherein the activating signal is the biasing potential, the first branch comprises a third switch and the second branch comprises a fourth switch, which third and fourth switches are arranged to receive the second switching signal.

8. An amplifying device according to claim 6, wherein the activating signal is the second switching signal, which has a potential corresponding to the biasing potential acting to connect the second and fourth transistors in parallel with the first and third transistors.

9. An amplifying device according to claim 1, wherein the transistors comprise MOSFET transistors.

10. An amplifying device according to claim 1, wherein the transistors comprise JFET transistors.

11. An amplifying device according to claim 1, wherein the transistors comprise bipolar transistors.

12. An amplifying device according to claim 1, wherein the switches comprise MOSFET transistors.

13. An amplifying device according to claim 1, wherein the switches comprise JFET transistors.

14. An amplifying device according to claim 1, wherein the switches comprise bipolar transistors.

15. A wireless transceiver comprising at least one amplifying device according to claim 1.

16. A radio transmission device comprising at least one amplifying device according to claim 1.

17. A radio transmission device according to claim 16, wherein the radio transmission device comprises a wireless access point.

18. A radio transmission device according to claim 16, wherein the radio transmission device comprises a wireless terminal.

* * * * *

UNITED STATES PATENT AND TRADEMARK OFFICE
CERTIFICATE OF CORRECTION

| | |
|---|---|
| PATENT NO. | : 7,872,530 B2 |
| APPLICATION NO. | : 12/530865 |
| DATED | : January 18, 2011 |
| INVENTOR(S) | : Phansathitwong et al. |

It is certified that error appears in the above-identified patent and that said Letters Patent is hereby corrected as shown below:

On the Title Page, in Field (73), under "Assignee", in Column 1, Line 1, delete "lm" and insert -- LM --, therefor.

In Fig. 2, Sheet 2 of 3, delete " 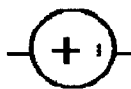 " and insert -- 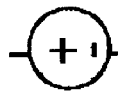 --, therefor.

Signed and Sealed this
Twenty-second Day of November, 2011

David J. Kappos
*Director of the United States Patent and Trademark Office*